US010488174B2

United States Patent
Chen et al.

(10) Patent No.: US 10,488,174 B2
(45) Date of Patent: Nov. 26, 2019

(54) SYSTEMS AND METHODS FOR WEARABLE VOLTAGE DETECTION DEVICES

(71) Applicant: General Electric Company, Schenectady, NY (US)

(72) Inventors: Cheng-Po Chen, Niskayuna, NY (US); Christopher Bruce Gushee, Marietta, GA (US); Jose Luis Virgen, Lancaster, CA (US); Emad Andarawis Andarawis, Ballston Lake, NY (US); Glen William Brooksby, Glenville, NY (US); Jeffrey Ross Mayton, Winnabow, NC (US); Nancy Cecelia Stoffel, Schenectady, NY (US); Wyatt Beale Smith, Media, PA (US); Daniel Leroy Olson, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/913,434

(22) Filed: Mar. 6, 2018

(65) Prior Publication Data
US 2019/0277617 A1    Sep. 12, 2019

(51) Int. Cl.
*G01B 7/14* (2006.01)
*G01R 19/155* (2006.01)
*G08B 21/02* (2006.01)

(52) U.S. Cl.
CPC ............ *G01B 7/14* (2013.01); *G01R 19/155* (2013.01); *G08B 21/02* (2013.01)

(58) Field of Classification Search
CPC ......... G01B 7/14; G08B 21/02; G01R 19/155
See application file for complete search history.

(56) References Cited

U.S. PATENT DOCUMENTS

| 3,309,690 A | 3/1967 | Moffitt |
| 4,101,825 A * | 7/1978 | Truax ................. G01R 29/12 |
| | | 324/458 |

(Continued)

FOREIGN PATENT DOCUMENTS

| EP | 1086334 B1 | 2/2004 |
| EP | 2572137 B1 | 8/2015 |

(Continued)

OTHER PUBLICATIONS

Lee et al., "Wearable haptic glove using micro hydraulic system for control of construction robot system with VR environment", 2008 IEEE International Conference on Multisensor Fusion and Integration for Intelligent Systems, pp. 638-643, Seoul, 2008.

(Continued)

*Primary Examiner* — Brian Wilson
(74) *Attorney, Agent, or Firm* — Ziolkowski Patent Solutions Group, SC

(57) ABSTRACT

A voltage detection device for detecting proximity to an active alternating current (AC) voltage source is provided. The device includes a housing, at least one antenna configured to generate a signal in response to exposure to electromagnetic radiation, signal processing circuitry configured to process the signal generated by the at least one antenna, a processing device embedded in the housing and communicatively coupled to the signal processing circuitry, the processing device configured to determine, from the processed signal, whether the voltage detection device is proximate to the active AC voltage source, and an electronic switch embedded in the housing and one of included within the processing device and communicatively coupled to the processing device, the electronic switch configured to reduce an impact of interference on detection of the active AC voltage source.

19 Claims, 5 Drawing Sheets

(56) References Cited

U.S. PATENT DOCUMENTS

| | | | |
|---|---|---|---|
| 4,884,252 A | 11/1989 | Teodoridis et al. | |
| 4,983,954 A | 1/1991 | Huston | |
| 5,103,165 A | 4/1992 | Sirattz | |
| 5,359,319 A | 10/1994 | Campbell et al. | |
| 6,329,924 B1* | 12/2001 | McNulty | G01R 29/0857 340/552 |
| 6,828,767 B2 | 12/2004 | Douglas | |
| 6,897,783 B2 | 5/2005 | Zeng et al. | |
| 7,253,642 B2 | 8/2007 | Kalokitis et al. | |
| 7,468,674 B2 | 12/2008 | Onachilla et al. | |
| 7,733,078 B2 | 6/2010 | Duke | |
| 8,378,967 B2 | 2/2013 | Noda et al. | |
| 8,575,942 B2* | 11/2013 | Dorr | G01R 29/08 324/326 |
| 8,882,285 B2 | 11/2014 | Walsh | |
| 9,265,331 B1 | 2/2016 | Hoffman | |
| 9,466,188 B2 | 10/2016 | Hamam et al. | |
| 9,494,632 B1 | 11/2016 | McNulty | |
| 2006/0009887 A1* | 1/2006 | Rubin | G01C 23/00 701/9 |
| 2007/0298724 A1* | 12/2007 | Sulkowski, Jr. | G01R 29/0814 455/67.13 |
| 2008/0024265 A1 | 1/2008 | Jones | |
| 2009/0192736 A1* | 7/2009 | McCullough | G01R 29/0871 702/60 |
| 2011/0234414 A1 | 9/2011 | Ojeda et al. | |
| 2012/0161958 A1* | 6/2012 | Turon | G01S 19/34 340/539.3 |
| 2014/0111208 A1* | 4/2014 | Olsson | G01V 3/10 324/329 |
| 2016/0085311 A1 | 3/2016 | Midholt et al. | |
| 2016/0209448 A1 | 7/2016 | Currie et al. | |
| 2017/0205454 A1 | 7/2017 | Rachakonda et al. | |

FOREIGN PATENT DOCUMENTS

| | | | |
|---|---|---|---|
| JP | H08194020 A | 7/1996 | |
| JP | H08220151 A | 8/1996 | |
| WO | 2014158030 A1 | 10/2014 | |
| WO | 2016122184 A1 | 8/2016 | |
| WO | 2017083901 A1 | 5/2017 | |
| WO | WO-2017083901 A1 * | 5/2017 | G01R 19/155 |

OTHER PUBLICATIONS

Baka et al., "Detecting and Avoiding Step Voltage Hazards", IEEE Transactions on Power Delivery, vol. 30, Issue: 6, pp. 2519-2526, Dec. 2015.

* cited by examiner

SYSTEMS AND METHODS FOR WEARABLE VOLTAGE DETECTION DEVICES

BACKGROUND

The subject matter described herein relates generally to voltage detection devices and, more particularly, to wearable voltage detection devices with improved accuracy and sensitivity.

Voltage sensing devices are used to detect active voltage sources within a predetermined distance of the device. At least some known voltage sensing devices must be intentionally activated by a user (i.e., they are not passive, automatic sensing devices), and have relatively limited range.

At least some known voltage sensing devices are wearable devices. Design constraints generally require such devices to be physically thin, low profile, and unobtrusive. When an active voltage source is detected, an alarm may be generated, emitting at least some electromagnetic interference. The electromagnetic interference may be coupled into the sensor input element if the alarm is generated near the sensor input element, impacting the ability of the voltage sensing device to accurately detect active voltage sources.

Further, at least some known voltage sensing devices include a housing made of a highly electrically insulative material, such as silicone rubber. When the housing moves relative to a sensor or other electronics, or if the housing contacts another object, an electric charge may be accumulated on the housing. This accumulated electric charge also interferes with the ability of at least some known voltage sensing devices to accurately detect active voltage sources.

BRIEF DESCRIPTION

In one aspect, a voltage detection device for detecting proximity to an active alternating current (AC) voltage source is provided. The device includes a housing sized and shaped to be worn by a user, at least one antenna embedded in the housing, the at least one antenna configured to generate a signal in response to exposure to electromagnetic radiation, signal processing circuitry embedded in the housing and communicatively coupled to the at least one antenna, the signal processing circuitry configured to process the signal generated by the at least one antenna, a processing device embedded in the housing and communicatively coupled to the signal processing circuitry, the processing device configured to determine, from the processed signal, whether the voltage detection device is proximate to the active AC voltage source, and an electronic switch embedded in the housing and one of included within the processing device and communicatively coupled to the processing device, the electronic switch configured to reduce an impact of interference on detection of the active AC voltage source.

In another aspect, a method for detecting proximity of a voltage detection device to an active alternating current (AC) voltage source is provided. The voltage detection device includes a housing sized and shaped to be worn by a user. The method includes generating, using at least one antenna embedded in the housing, a signal in response to exposure to electromagnetic radiation, processing the generated signal using signal processing circuitry embedded in the housing and communicatively coupled to the at least one antenna, determining, using a processing device embedded in the housing and communicatively coupled to the signal processing circuitry, based on the processed signal, whether the voltage detection device is proximate to the active AC voltage source, and reducing, using an electronic switch embedded in the housing and at least one of communicatively coupled to the processing device and included in the processing device, an impact of interference on detection of the active AC voltage source.

DRAWINGS

These and other features, aspects, and advantages of the present disclosure will become better understood when the following detailed description is read with reference to the accompanying drawings in which like characters represent like parts throughout the drawings, wherein.

Figure 1:
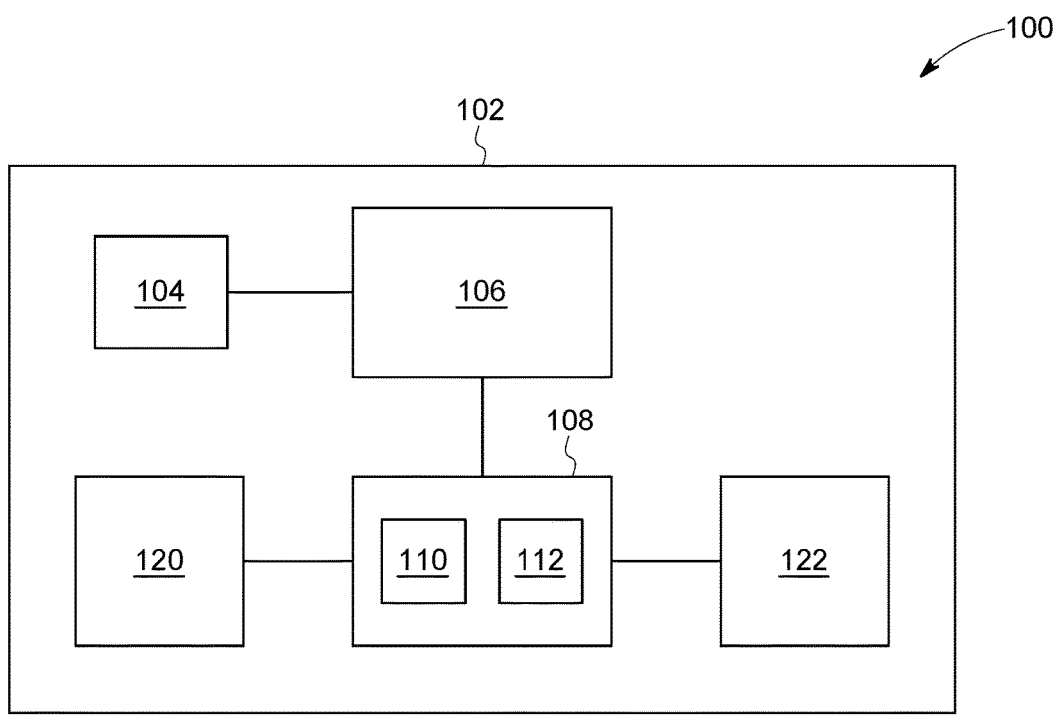
FIG. 1 is a block diagram of an exemplary voltage detection device.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by microcontrollers, field programmable gate arrays (FPGAs), embedded processors, personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The systems and methods described herein provide a wearable voltage detection device that detects proximity to active AC voltage sources and alerts a wearer accordingly. The voltage detection device includes a housing, and an antenna, signal processing circuitry, and microprocessor to facilitate detecting active AC voltage sources. The voltage detection device further includes an electronic switch to reduce electromagnetic interference from sources other than active AC voltage sources. In addition, the voltage detection device leverages particular materials and processing components to reduce or eliminate interference signals, improving the ability of the voltage detection device to detect active AC voltage sources.

FIG. 1 is a block diagram of an exemplary voltage detection device 100. As described herein, voltage detection device 100 is wearable by a user, and facilitates detecting an active alternating current (AC) voltage source (e.g., an energized wire) located near the user. As used herein, an active AC voltage source refers to any energized and/or current carrying electrical device capable of being detected using the systems and methods described herein. In the exemplary embodiment, voltage detection device 100 is capable of detecting AC voltages in a range from approximately 50 to 1000 VAC. Alternatively, voltage detection device 100 may be capable of detecting any range of voltages that enables voltage detection device 100 to function as described herein. Further, although voltage detection device 100 is described herein as detecting an active alternating current (AC) voltage source, in some embodiments, voltage detection device 100 may be used to detect additional phenomena (e.g., temperature, motion, etc.).

In the exemplary embodiment, voltage detection device 100 is a passive device that does not require the user to intentionally activate voltage detection device 100 or provide input to voltage detection device 100 to initiate detection. Instead, voltage detection device 100 automatically monitors for and detects AC voltage sources, and alerts the user to those detections. Alternatively, voltage detection device 100 may be an active device that requires user input to initiate detection.

Voltage detection device 100 is capable of detecting AC voltage sources within a distance range of voltage detection device 100 and an angular range of voltage detection device 100. In some embodiments, the distance range of voltage detection device 100 (e.g., for a 110V single phase AC source) may be up to approximately 20 centimeters (cm) (i.e., voltage detection device 100 is capable of detecting voltage sources at least up to 20 cm from voltage detection device 100). In other embodiments, the distance range of voltage detection device 100 may be up to approximately 40 cm. Further, in the exemplary embodiment, voltage detection device 100 has a substantially omnidirectional angular range. That is, voltage detection device 100 is capable of detecting voltage sources in substantially any direction relative to voltage detection device 100. Alternatively, voltage detection device 100 may have any distance range and angular range that enables voltage detection device 100 to function as described herein.

In some embodiments, the detection sensitivity of voltage detection device 100 may be modified by the user (e.g., using a user input device on voltage detection device 100), or automatically (e.g., as described below in regards to an electronic switch). Those of skill in the art will appreciate that any suitable technique may be used to modify the detection sensitivity (e.g., altering a threshold detection voltage, switching gain resistors, etc.).

As shown in FIG. 1, in the exemplary embodiment, voltage detection device 100 includes a housing 102 containing a plurality of components, as described in detail below. To reduce charge build up on voltage detection device 100, housing 102 is fabricated from an electrically dissipative material (e.g., polyurethane, carbon loaded silicone, thermoplastic polyurethane (TPU), a nylon or polymer modified with filler to have a lower volume resistivity than its native state, etc.). For example, the electrically dissipative material may have a resistivity in a range from approximately $1\times10^8$ ohm centimeters ($\Omega$·cm) to $1\times10^{10}$ $\Omega$·cm. A lower resistivity (e.g., $1\times10^6$ $\Omega$·cm) may reduce detection sensitivity of voltage detection device 100.

Figure 2:
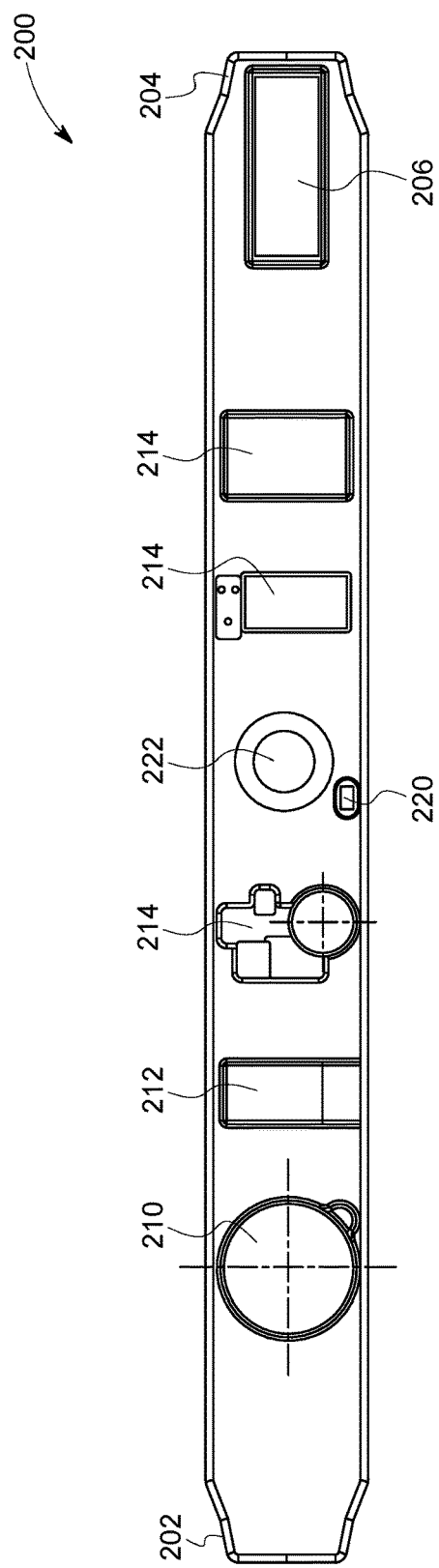
FIG. 2 is a schematic diagram of an exemplary wristband that may constitute the voltage detection device shown in FIG. 1.
Figure 3:
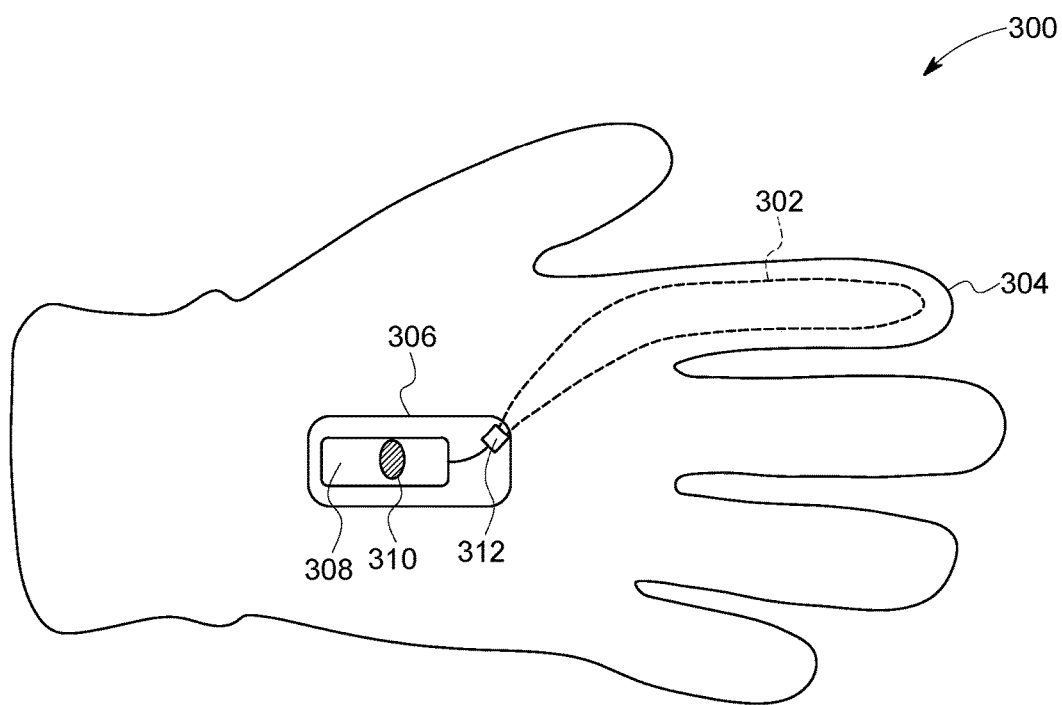
FIG. 3 is a schematic diagram of an exemplary glove that may constitute the voltage detection device shown in FIG. 1.

Further, in the exemplary embodiment, housing 102 is sized and shaped to be worn by the user. For example, housing 102 may form a wristband (as shown in FIG. 2) or a glove (as shown in FIG. 3). Further, in other embodiments, housing 102 may form a vest, a helmet, an armband, or an item attachable to a garment of the user (e.g., an identification badge). Housing 102 may also be water-resistant and/or submersible in some embodiments.

At least one antenna 104 is embedded in housing 102. Antenna 104 generates a signal in response to exposure to electromagnetic radiation (e.g., generated by an AC voltage source). Antenna 104 may be, for example, a loop of wire, a conductive trace, a conductive surface, etc. Alternatively, antenna 104 may have any configuration that enables voltage detection device 100 to function as described herein. For example, in some embodiments, antenna 104 is printed on an inherently static dissipative material, such as thermoplastic polyurethane (TPU). Further, in some embodiments, antenna 104 may have a segmented antenna structure with individual sense channels.

In the exemplary embodiment, antenna 104 is communicatively coupled to signal processing circuitry 106 that is also embedded in housing 102. Signal processing circuitry 106 receives and processes the signal generated by antenna 104. For example, signal processing circuitry 106 may perform filtering and/or amplification on the signal generated by antenna 104. In some embodiments, because a signal generated by an active AC voltage source will typically have a frequency in a range from approximately 50 Hertz (Hz) to 60 Hz, signal processing circuitry 106 filters out signal components outside of a range from approximately 50 Hz to 60 Hz (i.e., signal components that are not generally indicative of an active AC voltage source). Further, in case of a two phase or three phase power system, the detected signal may have higher frequency components that are of interest (e.g., 100, 120, 150 and/or 180 Hz). Accordingly, signal processing circuitry 106 may be configured to identify frequencies other than those in a range from approximately 50 Hz to 60 Hz in some embodiments. Further, in some embodiments, the frequency range detected by voltage detection device 100 may be adjustable by the user (e.g., using a user input device). For example, for aircraft power systems, it may be desirable to detect and alert on frequencies around approximately 400 Hz. Signal processing circuitry 106 may also be operable to filter out known noise signatures (e.g., fluorescent lights, welding equipment, motor starters, etc.). Still further, in some embodiments, the detected frequency range may be adaptively or automatically adjustable (e.g., based on frequency analysis of detected signals over time).

A microprocessor 108 is embedded in housing 102 and communicatively coupled to signal processing circuitry 106. Microprocessor 108 may be any suitable processing device capable of carrying out the functions described herein. Microprocessor 108 determines, from the processed signal generated by signal processing circuitry 106, whether voltage detection device 100 is proximate to an active AC voltage source. Microprocessor 108 may make this determination continuously or periodically (i.e., at a predetermined sampling rate). Further, the sampling rate may be dynamically adjusted (e.g., to reduce power consumption, improve detection, etc.) during operation.

In the exemplary embodiment, microprocessor 108 includes a memory device 110 and a processor 112 coupled to memory device 110. Processor 112 may include one or more processing units, such as, without limitation, a multicore configuration. Processor 112 is any type of processor that permits microprocessor 108 to operate as described herein. In some embodiments, executable instructions are stored in memory device 110. In some embodiments, historical signal levels are stored in memory device 110 for use in dynamically adjusting a detection threshold.

Microprocessor 108 is configurable to perform one or more operations described herein by programming processor 112. For example, processor 112 may be programmed by encoding an operation as one or more executable instructions and providing the executable instructions in memory device 110. In the exemplary embodiment, memory device 110 is one or more devices that enable storage and retrieval of information such as executable instructions or other data. Memory device 110 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program. In some embodiments, microprocessor 108 also includes a wireless communications interface for transmitting data from voltage detection device 100 to a remote computing device for storage and/or analysis.

In the exemplary embodiment, as shown in FIG. 1, voltage detection device 100 further includes an alert device 120 embedded in housing 102. Alert device 120 is communicatively coupled to microprocessor 108. In the event that microprocessor 108 determines that voltage detection device 100 is proximate to an active AC voltage source, microprocessor 108 causes alert device 120 to generate an alert. The generated alert may be any audio, visual, and/or tactile alert that facilitates making the user aware that the voltage detection device 100 is proximate to an active AC voltage source. For example, the alert may include a blinking light, a color-changing light, an audible signal (e.g., a beeping sound or siren sound), or a vibration. In some embodiments, the alert is a communication message (e.g., an SMS message) sent to a separate device. Those of skill in the art will appreciate that any suitable alert may be generated. In some embodiments, alert device 120 is not embedded in housing 102, but is a separate device (e.g., a separate wearable device) in wireless communication with the components in housing 102.

Voltage detection device 100 further includes an electronic switch 122 in the exemplary embodiment. Electronic switch 122 is embedded in housing 102 and communicatively coupled to microprocessor 108. Electronic switch 122 is operable to cause voltage detection device 100 to be less sensitive to interference (e.g., electromagnetic interference generated by alert device 120, electromagnetic interference generated by other, external sources of electromagnetic radiation, etc.).

Electronic switch 122 may be, for example, a physical switch or a logical switch (e.g., implemented on microprocessor 108). In some embodiments, electronic switch 122 is implemented as a gain/threshold modulator. Specifically, in such embodiments, electronic switch 122 is operable to change the detection sensitivity of voltage detection device 100 to reduce interference. For example, when a known interference signal is present (e.g., when current is supplied to alert device 120), electronic switch 122 may reduce the detection sensitivity to approximate zero for a relatively short predetermined period of time (e.g., on the order of milliseconds). Accordingly, voltage detection device 100 does not attempt to detect the active AC voltage source during the relatively short predetermined period of time, to ensure that interference occurring during that predetermined period of time does not impact detection. In another example, electronic switch 122 may scale the sensitivity of voltage detection device 100 based on an amount of detected background interference or noise. In these examples, the detection sensitivity may be adjusted by at least one of changing signal gain and detection thresholds.

In other embodiments, electronic switch 122 is operable to discharge any accumulated charge on voltage detection device 100 and/or discharge a logical value (i.e., a digital value in microprocessor 108). For example, electronic switch 122 may discharge a physical or logical detector accumulator by a predetermined amount over a predetermined period of time when a known interference signal (e.g., when current is supplied to alert device 120). Specifically, electronic switch 122 generates a generally equal and opposite signal to the known interference. Further, in another example, electronic switch 122 may discharge a physical or logical detector accumulator by an amount substantially equal to a predetermined or detected background interference level. That is, voltage detection device 100 may detect or have stored a background interference level, and electronic switch 122 generates a generally equal and opposite signal to the background interference level.

Regarding accumulated electrical charge, during use, electrical charge may accumulate on voltage detection device 100. This accumulated electrical charge is generally undesirable, as it may cause electromagnetic interference that impedes the ability of voltage detection device 100 to accurately detect the presence of an active AC voltage source. For example, accumulated electrical charge may cause voltage detection device 100 to generate a false alarm when no active AC voltage source is present. In some embodiments, electronic switch 122 is operable to reduce electromagnetic interference generated by alert device 120. Further, in some embodiments, electronic switch 122 is operable to reduce electromagnetic interference generated by other, external sources of electromagnetic radiation. Electronic switch 122 may discharge any accumulated charge after a predetermined period of time (e.g., after a predetermined number of cycles of an alert generated by alert device 120) and/or after certain conditions are satisfied (e.g., after an accumulated charge on said voltage detection device 100 reaches a threshold level). Accordingly, after electronic switch 122 discharges any accumulated charge, voltage detection device 100 can again attempt to detect (without interference from the accumulated charge) the presence of an active AC voltage source.

Voltage detection device 100 may include components other than those shown in FIG. 1. For example, in some embodiments (e.g., those described below in association with FIG. 8), voltage detection device 100 includes at least one motion or contact sensor that automatically detects that a user is wearing voltage detection device 100, and activates voltage detection device (e.g., by activating microprocessor 108) accordingly. Further, in some embodiments, voltage detection device 100 includes a voltage generator capable of generating a small voltage calibration signal to test operation/adjust sensitivity of voltage detection device 100. In another embodiment, voltage detection device 100 includes an energy harvester (e.g., a piezoelectric device) that charges a battery of voltage detection device 100 from motion and/or exposure to electric fields. In addition, in some embodiments, voltage detection device 100 includes a user interface (e.g., a switch or button). The user interface can be used to disable or silence the alert functionality (e.g., during transport or battery charging). Further, in some embodiments, the alert functionality will be automatically disabled when the battery is being charged.

Although voltage detection device 100 is described herein as generally detecting the presence of an active AC voltage source, in some embodiments, voltage detection device 100 may include additional sensors for detecting other phenomena. For example, in some embodiments, voltage detection device 100 may include temperature detection or chemical detection sensors.

FIG. 2 is a schematic diagram of an exemplary wristband 200 that may constitute, for example, voltage detection device 100 (shown in FIG. 1). Wristband 200 is generally flexible, and is sized and shaped to be worn on a wrist of a user. Wristband 200 extends between a first end 202 and an opposite second end 204. Further, wristband 200 includes a coupling mechanism 206 for coupling first end 202 to second end 204 (i.e., such that wristband 200 forms a loop that encircles the user's wrist). Coupling mechanism 206 may include a hook and loop fastener, a magnetic fastener, a snap-fit fastener, or any other suitable coupling device.

In the exemplary embodiment, wristband 200 includes a battery 210. In some embodiments, battery 210 is a rechargeable battery that may be recharged via a charging port 212 (e.g., a micro USB charging port). Further, battery 210 may have, for example, at least twelve hours of battery life. In some embodiments, battery 210 may be a super capacitor. Further, charging of battery 210 may be accomplished using one or more energy harvesting devices on voltage detection device 100 (e.g., capable of harvesting energy from vibration, thermoelectric exposure, etc.). Wristband 200 also includes a plurality of electronics components 214 that may include, for example, antenna 104, signal processing circuitry 106, microprocessor 108, alert device 120, and/or electronic switch 122 (all shown in FIG. 1). In some embodiments, antenna 104 is a conductive loop that generally extends between first and second ends 202 and 204.

Wristband 200 includes a light-emitting diode (LED) 220, as shown in FIG. 2. LED may form alert device 120 (e.g., by generating visual alerts) and/or may be used to indicate, for example, a charge status or power level of wristband 200. Further, in the exemplary embodiment, wristband 200 includes a user input device 222 (e.g., a switch or button) that enables selectively activating one or more components of wristband 200. Using user input device 222, the user may also adjust sensitivity (e.g., adjust the detection range) of wristband 200 in some embodiments. Those of skill in the art will appreciate that wristband 200 may include additional, fewer, or alternative components.

FIG. 3 is a schematic diagram of an exemplary glove 300 that may constitute, for example, voltage detection device 100 (shown in FIG. 1). Glove 300 is sized and shaped to be worn on a hand of a user. In the exemplary embodiment, a loop antenna 302, such as antenna 104 (shown in FIG. 1) is embedded in glove 300 and extends through a finger 304 of glove. In some embodiments, loop antenna 302 may extend through multiple fingers 304 and/or a portion of glove 300 covering the back of the user's hand.

Further, glove 300 includes a pouch or pocket 306 that is sized to receive an energized electrical alert device (EEAD) 308. EEAD 308 may include signal processing circuitry 106, microprocessor 108, alert device 120, and/or electronic switch 122 (all shown in FIG. 1). For example, EEAD 308 includes an LED 310 that may form alert device 120 (e.g., by generating visual alerts) and/or may be used to indicate, for example, a charge status or power level of EEAD 308. Further, as shown in FIG. 3, pocket 306 includes a connector 312 that communicatively couples loop antenna 302 to EEAD 308 when EEAD 308 is inserted into pocket 306. Because EEAD 308 is removable from pocket 306, when glove 300 itself wears out, EEAD 308 can be removed and inserted into another glove. Further, EEAD 308 may be used with different types of gloves for different applications.

Figure 4:
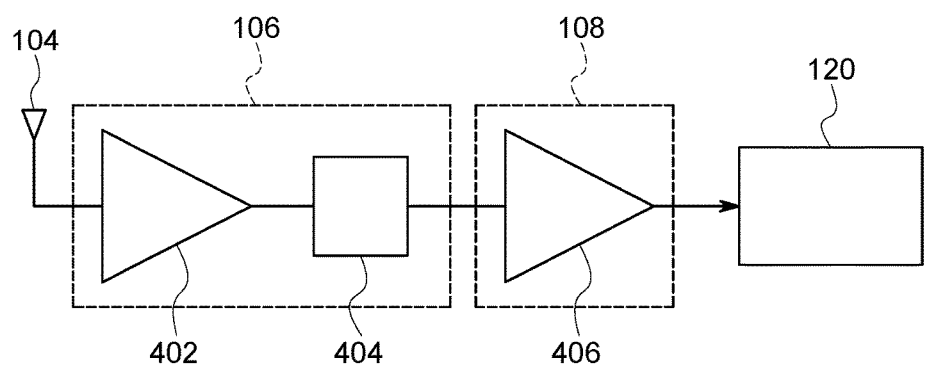
FIG. 4 is a schematic diagram of one embodiment of an antenna, signal processing circuitry, microprocessor, and alert device that may be used with the voltage detection device shown in FIG. 1.

FIG. 4 is a schematic diagram of one embodiment of antenna 104, signal processing circuitry 106, microprocessor 108, and alert device 120. In the embodiment shown in FIG. 4, signal processing circuitry 106 includes an amplifier 402 and a filter 404. Amplifier 402 amplifies the signal received from antenna 104 to increase sensitivity (e.g., to detect relatively low voltage signals). Further, filter 404 filters the amplified signal. For example, as described above, filter 404 may filter out signal components outside of a range from approximately 50 Hz to 60 Hz.

In this embodiment, microprocessor 108 includes a threshold detector 406. Threshold detector 406 compares the processed signal to a predetermined threshold (e.g., a threshold voltage), and detects the presence of an active AC voltage source when the processed signal exceeds the predetermined threshold. The predetermined threshold may be defined, for example, in memory device 110. Upon detecting an active AC voltage source, microprocessor 108 instructs alert device 120 to generate an alert.

Figure 5:
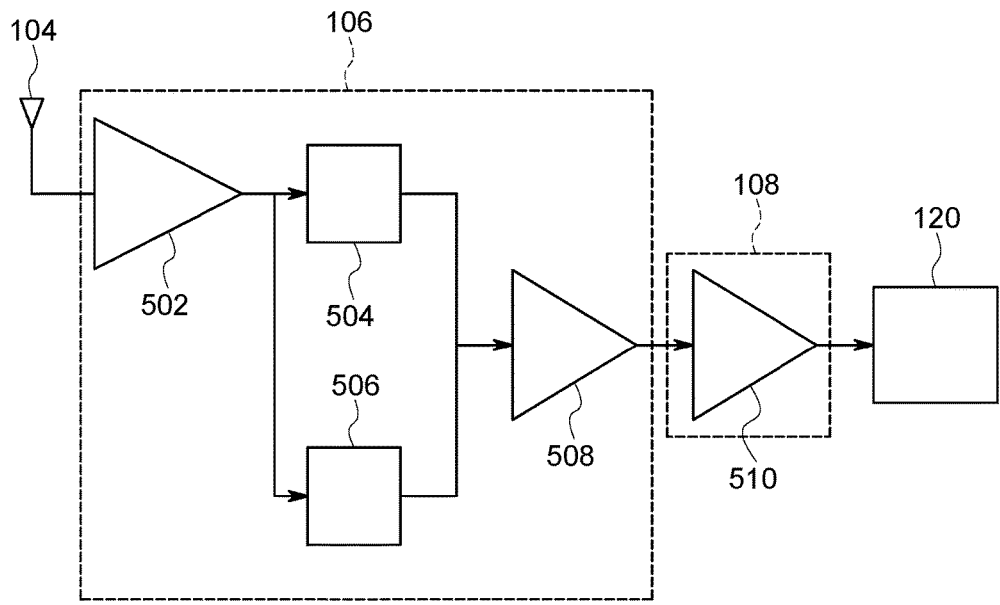
FIG. 5 is a schematic diagram of an alternative embodiment of an antenna, signal processing circuitry, microprocessor, and alert device that may be used with the voltage detection device shown in FIG. 1.

FIG. 5 is a schematic diagram of an alternative embodiment of antenna 104, signal processing circuitry 106, microprocessor 108, and alert device 120. In the embodiment shown in FIG. 5, signal processing circuitry 106 includes an amplifier 502, similar to amplifier 402 (shown in FIG. 4). Amplifier 502 amplifies the signal received from antenna 104 to increase sensitivity (e.g., to detect relatively low voltage signals).

Signal processing circuitry 106 further includes a first filter 504 and a second filter 506 coupled in parallel to an output of amplifier 502. First and second filters 504 and 506 filter the amplified signal. For example, first filter 504 may be a 60 Hz notch filter, and second filter 506 may be a broadband filter. To facilitate minimizing false alarms, the outputs of first and second filters 504 and 506 are combined by a signal combiner 508. A threshold detector 510 of microprocessor 108 (similar to threshold detector 406 (shown in FIG. 4)) compares the output of signal combiner 508 signal to a predetermined threshold (e.g., a threshold voltage), and detects the presence of an active AC voltage source when the processed signal exceeds the predetermined threshold. The predetermined threshold may be defined, for example, in memory device 110. Upon detecting an active AC voltage source, microprocessor 108 instructs alert device 120 to generate an alert.

Figure 6:
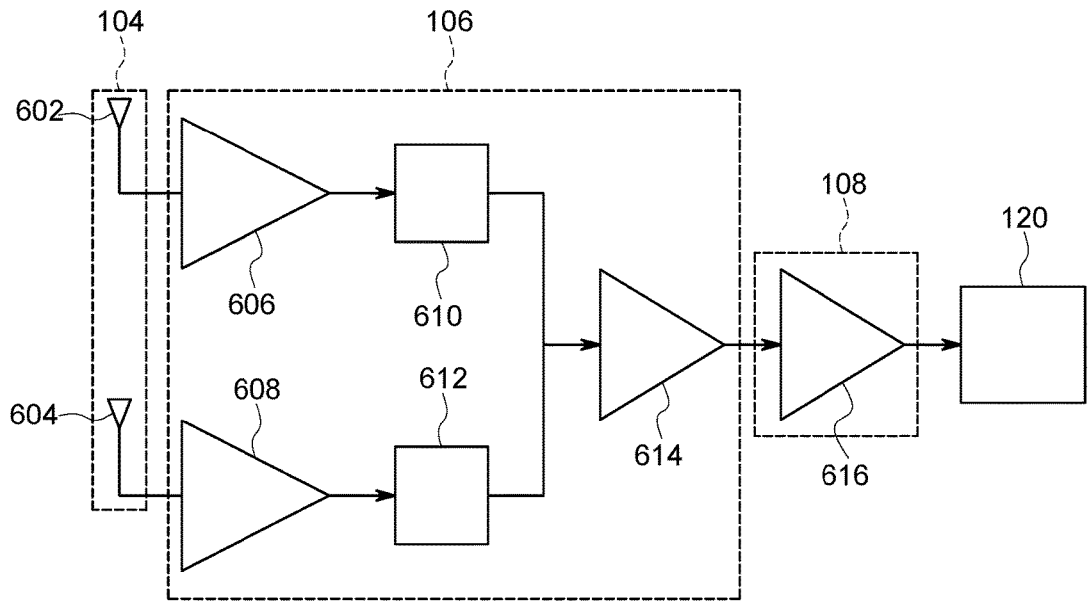
FIG. 6 is a schematic diagram of an alternative embodiment of an antenna, signal processing circuitry, microprocessor, and alert device that may be used with the voltage detection device shown in FIG. 1.

FIG. 6 is a schematic diagram of an alternative embodiment of antenna 104, signal processing circuitry 106, microprocessor 108, and alert device 120. In the embodiment shown in FIG. 6, antenna 104 includes a first antenna 602 and a second antenna 604. Using multiple antennas facilitates localizing a detected electric field (i.e., to minimize spurious detections from power sources other than active AC voltage sources). For example, in this embodiment, first antenna 602 has a first orientation, and second antenna 604 has a second orientation substantially orthogonal to the first orientation. In embodiments including two or more antennas, the signals may be combined into a weighted sum (e.g., based on signal to noise ratio). Further, in such embodiments, an alert may be generated if a predetermined number of antennas (e.g., x antennas out of y total antennas) detect the signal.

As shown in FIG. 6, in this embodiment, signal processing circuitry 106 includes a first amplifier 606 communicatively coupled to first antenna 602 and a second amplifier 608 communicatively coupled to second antenna 604. Each of first and second amplifiers 606 and 608 is similar to amplifier 402 (shown in FIG. 4), and amplifies the signal received from the respective antenna to increase sensitivity (e.g., to detect relatively low voltage signals). Further, a first filter 610 and a second filter 612 (each similar to filter 404 (shown in FIG. 4)) are communicatively coupled to first and second amplifiers 606 and 608, respectively.

The outputs of first and second filters 610 and 612 are combined by a signal combiner 614. A threshold detector 616 of microprocessor 108 (similar to threshold detector 406 (shown in FIG. 4)) compares the output of signal combiner 614 signal to a predetermined threshold (e.g., a threshold voltage), and detects the presence of an active AC voltage source when the processed signal exceeds the predetermined threshold. The predetermined threshold may be defined, for example, in memory device 110. Upon detecting an active AC voltage source, microprocessor 108 instructs alert device 120 to generate an alert.

Figure 7:
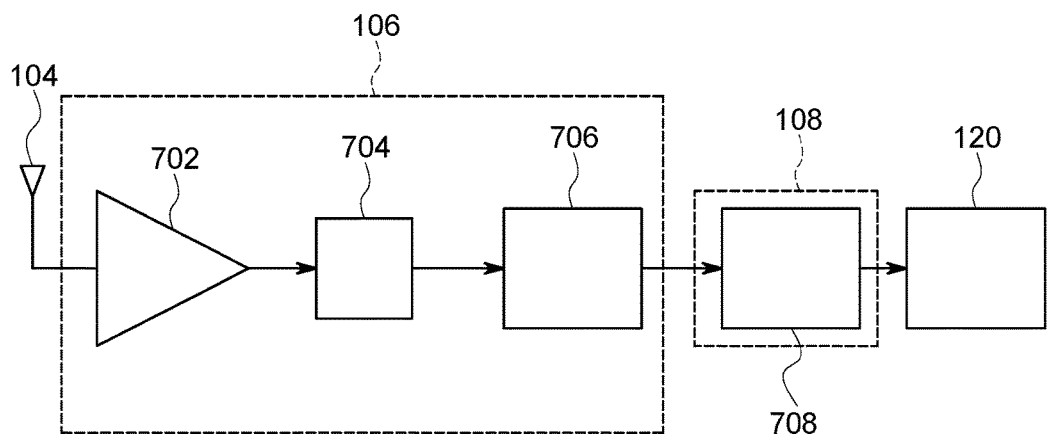
FIG. 7 is a schematic diagram of an alternative embodiment of an antenna, signal processing circuitry, microprocessor, and alert device that may be used with the voltage detection device shown in FIG. 1.

FIG. 7 is a schematic diagram of an alternative embodiment of antenna 104, signal processing circuitry 106, microprocessor 108, and alert device 120. In the embodiment shown in FIG. 7, signal processing circuitry 106 includes an amplifier 702, similar to amplifier 402 (shown in FIG. 4). Amplifier 702 amplifies the signal received from antenna 104 to increase sensitivity (e.g., to detect relatively low voltage signals). Signal processing circuitry 106 further includes a filter 704, similar to filter 404 (shown in FIG. 4), that filters the amplified signal.

In the embodiment shown in FIG. 7, signal processing circuitry 106 also includes an analog to digital converter (ADC) 706 that digitizes the output of filter 704. Accordingly, in this embodiment, microprocessor 108 includes digital circuitry 708 (e.g., digital filters, discriminator, threshold detector, waveform display) to determine the presence of an active AC voltage source and instructs alert device 120 to generate an alert as appropriate. In some embodiments, filter 704 is omitted, and filtering is performed by digital circuitry 708. Digital signal processing allows for more sophisticated processing algorithms (e.g., processing different signal bands, looking for specific frequency signatures for one, two, and three phase power systems, generating dynamic thresholds, and/or increasing sensitivity to rate of change in a detected electromagnetic field).

Those of skill in the art will appreciate that any suitable signal processing and/or filtering techniques may be used by voltage detection device 100. For instance, in one approach, an incoming signal is rectified, and a window function is employed such that a valid detection of the active AC voltage source is only triggered if the rectified signal is detected as being above a threshold a predetermined number of times within a detection window. The predetermined number of times may be determined based on twice the expected frequency range (given the rectification). For example, a rectified signal from a 60 Hz source will have content at double the frequency. Accordingly, an active AC voltage source detection may be registered (and an alarm generated) if approximately twelve threshold crossings (e.g., ten to fourteen threshold crossings) are observed during a 0.1 second detection window. The detection window may also be modified as a function of signal strength. For example, if during the first 0.05 seconds, approximately six detections (e.g., five to seven detections) occur at a sufficiently high signal magnitude, that may be considered a valid detection. This enables quicker detection when the signal is stronger (which generally occurs when the user is closer to the active AC source and/or the active AC source is at a higher voltage). The range of threshold crossings required to trigger a detection may be set to cover specific discrete frequencies (e.g., 50 Hz, 60 Hz, and 400 Hz) or a continuous range of frequencies (e.g., from 50 to 400 Hz). Similar processing may also be performed on non-rectified signals (e.g., with half the number of required threshold crossings).

Further, in another example, a frequency analysis (e.g., a Fast Fourier Transform) may be run to determine the frequency content of incoming signals. Further, frequency analysis could also be performed using a lock-in amplifier (which may sometimes be referred to as frequency demodulation) on a specific frequency of interest or set of frequencies of interest. For frequency demodulation, the output has a magnitude indicative of the signal strength of the frequency of interest.

Figure 8:
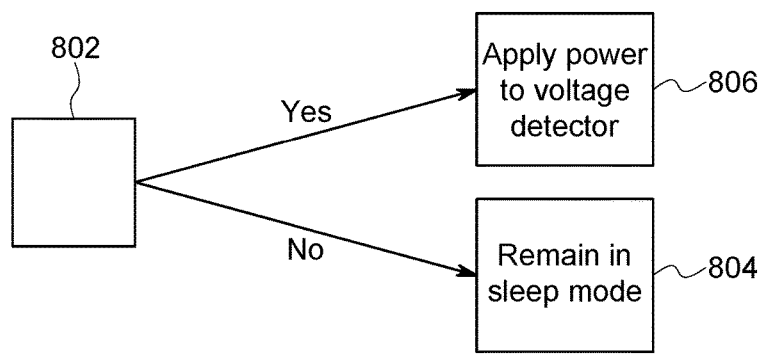
FIG. 8 is a block diagram illustrating operation of a motion or contact sensor that may be used with the voltage detection device shown in FIG. 1.

As noted above, in some embodiments, voltage detection device 100 includes at least one motion or contact sensor that automatically detects that a user is wearing voltage detection device 100, and activates voltage detection device (e.g., by activating microprocessor 108) accordingly. FIG. 8 is a block diagram illustrating operation of a motion or contact sensor 802. Sensor 802 may be any sensing device that is capable of determining that a user is wearing voltage detection device 100.

For example, in one embodiment, sensor 802 is an accelerometer that detects movement of voltage detection device 100 (which is indicative of a user wearing voltage detection device 100). Further, the accelerometer may detect sudden movement indicative of an impact accident, and generate a suitable alert in response to the detection (e.g., a "man down" alert). In another embodiment, sensor 802 is a contact or touch sensor that detects contact with the skin of a user (which is indicative of a user wearing voltage detection device 100).

Sensor 802 facilitates maximizing battery life and minimizing power consumption of voltage detection device 100. Specifically, in the exemplary embodiment, sensor 802 continuously or periodically determines whether motion or contact is detected. If sensor 802 does not detect motion or contact, one or more components of voltage detection device 100 (e.g., signal processing circuitry 106, microprocessor 108, and/or alert device 120) remain 804 in a sleep mode, or low-power consumption mode. When sensor 802 does detect motion or contact, the one or more components are activated (i.e., by applying 806 power to those components) such that voltage detection device 100 can readily detect active AC voltage sources. Further, if sensor 802 does not detect motion or contact for a predetermined period of time after activating the one or more components, voltage detection device 100 returns to the low-power mode.

Voltage detection device 100 may also include additional features to facilitate conserving power. For example, in some embodiments, when a filtered signal is received by the microprocessor, the microprocessor may initially compare the filtered signal to a threshold, and only digitize the signal for the purposes of analyzing the filtered signal (e.g., by activating an analog to digital converter (ADC)) when the filtered signal exceeds the threshold. Thus, the microprocessor and ADC may operate in a low power mode while relatively low power circuitry monitors the signal and only triggers the more power intensive circuitry when there is a signal that should be further analyzed.

The embodiments described herein include a wearable voltage detection device that detects proximity to active AC voltage sources and alerts a wearer accordingly. The voltage detection device includes a housing, and an antenna, signal processing circuitry, and microprocessor to facilitate detecting active AC voltage sources. The voltage detection device further includes an electronic switch to reduce electromagnetic interference from sources other than active AC voltage sources. In addition, the voltage detection device leverages particular materials and processing components to reduce or eliminate interference signals, improving the ability of the voltage detection device to detect active AC voltage sources.

An exemplary technical effect of the methods, systems, and apparatus described herein includes at least one of: (a) using non-contact voltage sensing to determine if a user is near an active AC voltage source; (b) improving sensitivity and reducing false alarms when detecting active AC voltage sources; and (c) improving power management of the voltage detection device to improve battery life.

Exemplary embodiments of a wearable voltage detection device are described herein. The electronic systems, and methods of operating and manufacturing such systems and devices are not limited to the specific embodiments described herein, but rather, components of systems and/or steps of the methods may be utilized independently and separately from other components and/or steps described herein. For example, the methods may also be used in combination with other electronic system, and are not limited to practice with only the electronic systems, and methods as described herein. Rather, the exemplary embodiment can be implemented and utilized in connection with many other electronic systems.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A voltage detection device for detecting proximity to an active alternating current (AC) voltage source, said voltage detection device comprising:
a housing sized and shaped to be worn by a user;
at least one antenna embedded in said housing, said at least one antenna configured to generate a signal in response to exposure to electromagnetic radiation;

signal processing circuitry embedded in said housing and communicatively coupled to said at least one antenna, said signal processing circuitry comprising:
a signal combiner communicatively coupled to each of a first and second filter, said signal combiner configured to combine outputs of said first and second filters into a processed signal;
said first filter communicatively coupled to a first amplifier and configured to filter an amplified signal output by said first amplifier;
said second filter communicatively coupled to said first amplifier or a second amplifier, and configured to filter said amplified signal output by said first amplifier or filter an amplified signal output by said second amplifier; and
wherein said first amplifier is communicatively coupled to a first antenna of said at least one antenna and configured to amplify the signal generated by said first antenna when said first and second filters are communicatively coupled to said first amplifier, or wherein said first amplifier is communicatively coupled to said first antenna of said at least one antenna and configured to amplify the signal generated by said first antenna and said second amplifier is communicatively coupled to a second antenna of said at least one antenna and configured to amplify the signal generated by said second antenna when said second filter is communicatively coupled to said second amplifier;
a processing device embedded in said housing and communicatively coupled to said signal processing circuitry, said processing device configured to determine, from the processed signal, whether said voltage detection device is proximate to the active AC voltage source; and
an electronic switch embedded in said housing and one of included within said processing device and communicatively coupled to said processing device, said electronic switch configured to reduce an impact of interference on detection of the active AC voltage source.

2. The voltage detection device in accordance with claim 1, wherein said housing comprises an electrically dissipative material.

3. The voltage detection device in accordance with claim 1, further comprising an alert device embedded in said housing and communicatively coupled to said processing device, said alert device configured to generate an alert in response to a determination that said voltage detection device is proximate the active AC voltage source, said electronic switch configured to reduce interference generated by said alert device.

4. The voltage detection device in accordance with claim 1, wherein said processing device is further configured to cause said electronic switch to discharge an accumulated charge on said voltage detection device to reduce electromagnetic interference.

5. The voltage detection device in accordance with claim 1, wherein when said first and second filters of said signal processing circuitry are communicatively coupled to said first amplifier, they are connected in parallel.

6. The voltage detection device in accordance with claim 1, wherein said voltage detection device has a distance range of approximately 20 centimeters or approximately 40 centimeters.

7. The voltage detection device in accordance with claim 1, wherein said housing forms one of a wristband, a glove, a vest, and a helmet.

8. The voltage detection device in accordance with claim 1, wherein said signal processing circuitry is configured to filter out signal components outside of a frequency range specified by the user.

9. The voltage detection device in accordance with claim 1, further comprising an accelerometer embedded in said housing and communicatively coupled to said processing device, said accelerometer configured to:
detect movement of said voltage detection device;
selectively activate said processing device based on the detected movement; and
selectively deactivate the processing device if no additional movement is detected for a predetermined period of time.

10. A method for detecting proximity of a voltage detection device to an active alternating current (AC) voltage source, the voltage detection device including a housing sized and shaped to be worn by a user, said method comprising:
generating, using at least one antenna embedded in the housing, at least one signal in response to exposure to electromagnetic radiation;
processing each generated signal into a processed signal using signal processing circuitry embedded in the housing and communicatively coupled to the at least one antenna;
determining, using a processing device embedded in the housing and communicatively coupled to the signal processing circuitry, based on each processed signal, whether the voltage detection device is proximate to the active AC voltage source; and
reducing, using an electronic switch embedded in the housing and at least one of communicatively coupled to the processing device and included in the processing device, an impact of interference on detection of the active AC voltage source;
wherein reducing an impact of interference with the electronic switch comprises discharging an accumulated charge on the voltage detection device, a logical value of the processing device, or a combination thereof by generating a generally equal and opposite signal to an interference signal or level.

11. The method in accordance with claim 10, wherein generating the at least one signal comprises generating the at least one signal using an antenna of said at least one antenna embedded in an electrically dissipative material.

12. The method in accordance with claim 11, wherein generating the at least one signal comprises generating the at least one signal using an antenna of said at least one antenna embedded in at least one of polyurethane, carbon loaded silicone, thermoplastic polyurethane, a polymer modified with filler to have a lower volume resistivity, and a nylon modified with filler to have a lower volume resistivity.

13. The method in accordance with claim 10, further comprising generating, using an alert device embedded in the housing and communicatively coupled to the processing device, an alert in response to a determination that the voltage detection device is proximate the active AC voltage source, wherein reducing an impact of interference comprises reducing interference generated by the alert device.

14. The method in accordance with claim 10, wherein processing each generated signal comprises:
amplifying each generated signal into an amplified signal using a first amplifier communicatively coupled to a first antenna of the at least one antenna, or using the first amplifier and a second amplifier communicatively coupled to the first and antenna and a second antenna of the at least one antenna respectively;

filtering each amplified signal by first and second filters; and combining each filtered signal into each processed signal using a signal combiner.

15. The method in accordance with claim 10, wherein the voltage detection device has a distance range of approximately 20 centimeters or approximately 40 centimeters.

16. The method in accordance with claim 10, wherein the voltage detection device has a substantially omnidirectional angular range.

17. The method in accordance with claim 10, wherein generating the at least one signal comprises generating the at least one signal using an antenna of said at least one antenna embedded in one of a wristband and a glove.

18. The method in accordance with claim 10, wherein processing each generated signal comprises filtering out signal components outside of a first range using a first filter and filtering out signal components outside a second range using a second filter.

19. The method in accordance with claim 10, further comprising:

detecting movement of the voltage detection device using an accelerometer embedded in the housing; and activating the processing device based on the detected movement.

\* \* \* \* \*